(12) United States Patent
Lin et al.

(10) Patent No.: US 7,176,141 B2
(45) Date of Patent: Feb. 13, 2007

(54) PLASMA TREATMENT TO IMPROVE BARRIER LAYER PERFORMANCE OVER POROUS LOW-K INSULATING DIELECTRICS

(75) Inventors: Simon Lin, Hsinchu (TW); Simon Jang, Hsin-Chu (TW); Douglas Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/936,272

(22) Filed: Sep. 7, 2004

(65) Prior Publication Data

US 2006/0051947 A1    Mar. 9, 2006

(51) Int. Cl.
*H01L 21/302* (2006.01)

(52) U.S. Cl. .............................. 438/710; 257/E21.001

(58) Field of Classification Search ................. 438/689, 438/707, 710, 798
See application file for complete search history.

(56) References Cited

U.S. PATENT DOCUMENTS

| 6,537,896 B1 * | 3/2003 | Catabay et al. ............. 438/474 |
| 6,673,721 B1 * | 1/2004 | Kim et al. .................. 438/725 |
| 6,933,246 B2 * | 8/2005 | Buchanan et al. .......... 438/778 |
| 2001/0045651 A1 * | 11/2001 | Saito et al. ................. 257/750 |

* cited by examiner

*Primary Examiner*—Scott B. Geyer
(74) *Attorney, Agent, or Firm*—Tung & Associates

(57) ABSTRACT

A method for plasma treating an etched opening formed in a porous low-K material to improve barrier layer integrity including providing a substrate comprising an etched opening formed in an insulating dielectric layer including porous low-K silicon oxide according to an overlying patterned resist layer; plasma treating according to a plasma process the etched opening to remove the resist layer and increase a surface density of the insulating dielectric layer within the etched opening; and, blanket depositing a barrier layer over the etched opening.

24 Claims, 3 Drawing Sheets

PLASMA TREATMENT TO IMPROVE BARRIER LAYER PERFORMANCE OVER POROUS LOW-K INSULATING DIELECTRICS

FIELD OF THE INVENTION

This invention generally relates to methods for forming semiconductor device micro-circuitry including metal filled features forming electrical interconnects and more particularly to a method for plasma treating etched openings formed in porous low-K dielectric insulating layers to improve barrier layer performance including reducing metal penetration through a barrier layer.

BACKGROUND OF THE INVENTION

Copper metallization is increasingly being used for advanced semiconductor device integrated circuit fabrication including semiconductor features having sub-quarter micron linewidths and high aspect ratios to larger features such as bonding pads. Copper and its alloys have lower resistivity and better electromigration resistance compared to other metals such as, for example, aluminum. These characteristics are critical for achieving device reliability together with higher current densities and increased signal propagation speed. While several processing difficulties related to forming copper semiconductor features have been overcome, several problems remain, including the problem of barrier layer integrity formed over low-K porous dielectric insulating layers and the consequent tendency of metals, for example copper, to penetrate and electro-migrate through the dielectric insulating layer.

Low-K porous dielectric insulating layers are increasingly used in forming smaller, high speed devices. Porosity is intentionally introduced into dielectric insulating layers by various methods in order to reduce the dielectric constant of the material and thereby increase the electrical signal transport speed. As device sizes continue to shrink, the level of porosity introduced into the low-K material has increased to further decrease the dielectric constant. Co-extensively with the evolution of smaller devices including metal interconnect lines, barrier layers lining an etched metal interconnect opening have been commonly used to prevent penetration and electro-migration of the metal, for example copper, used to fill the metal interconnect.

One increasing problem with prior art methods of forming barrier layers, for example refractory metals and metal nitrides, is achieving adequate coverage of the barrier layers over the low-K material. For example, as device sizes decreases, scaling considerations also require thinner barrier layers. The coextensive requirements of thinner barrier layers and more porous low-K dielectric insulating layers has led to problems with the integrity of barrier layers, frequently leading to metal electromigration, and subsequent device degradation.

Thus, there is a continuing need for novel semiconductor micro-circuitry manufacturing methods to improve the electrical performance of metal interconnect features including improved manufacturing methods to improved barrier layer integrity while reducing manufacturing cycle times.

It is therefore among the objects of the invention to provide a method to improve the electrical performance of metal interconnect features including improved manufacturing methods to improved barrier layer integrity while reducing manufacturing cycle times, in addition to overcoming other shortcomings of the prior art.

SUMMARY OF THE INVENTION

To achieve the foregoing and other objects, and in accordance with the purposes of the present invention, as embodied and broadly described herein, the present invention provides a method for plasma treating an etched opening formed in a porous low-K material to improve barrier layer integrity.

In a first embodiment, the method includes providing a substrate comprising an etched opening formed in an insulating dielectric layer including porous low-K silicon oxide according to an overlying patterned resist layer; plasma treating according to a plasma process the etched opening to remove the resist layer and increase a surface density of the insulating dielectric layer within the etched opening; and, blanket depositing a barrier layer over the etched opening.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary copper interconnect structure (feature) such as a dual damascene, it will be appreciated that the process may be equally as well used in forming single damascene structures as well as thicker and wider structures such as bonding pads and wide trenches. By the term damascene is meant any damascene e.g., both single and dual damascenes. Further, it will be appreciated that the metal used to fill the metal interconnect may include tungsten, aluminum, copper and alloys thereof. The method of the present invention is particularly advantageously used in the formation of copper damascene features such as vias and trench lines with linewidths/diameters less than about 0.25 microns, more preferably less than about 0.18 microns, e.g., 0.13 microns and lower. In addition, the method is particularly advantageously used with silicon oxide based low-K dielectric insulating layers having an interconnecting porous structure and having a dielectric constant of less than about 3.0 including less than about 2.5, for example from about 2.2 to about 3.0. Further, the term 'copper' will be understood to include copper and alloys thereof.

For example, in an exemplary embodiment, referring to FIGS. 1A–1E, are shown cross sectional views of a portion of a multi-level semiconductor device at stages in an integrated circuit manufacturing process.

Figure 1A:
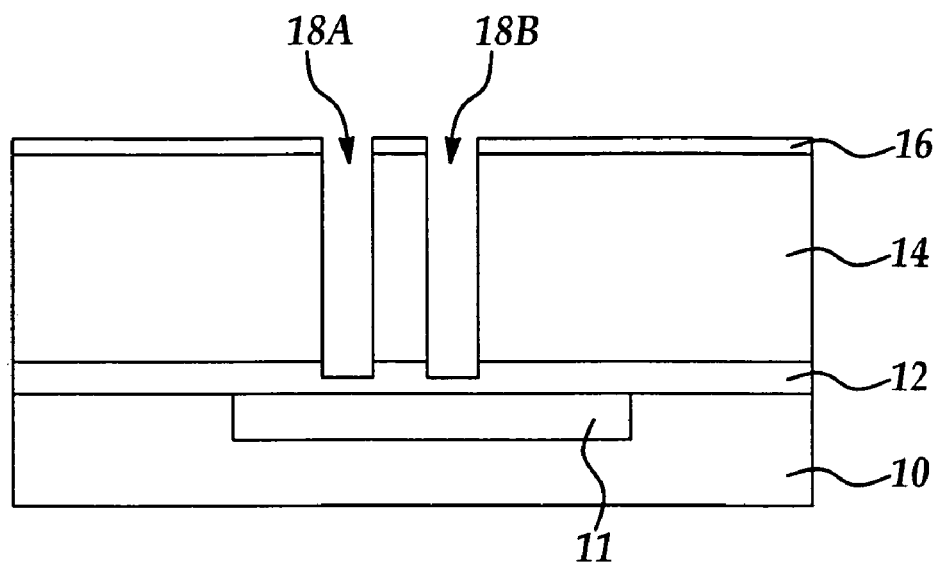
FIGS. 1A to 1E are cross-sectional views of a portion of a multi-layer semiconductor device at stages in a manufacturing process according to an exemplary embodiment of the present invention.

Referring to FIG. 1A, a conductive region 11 is formed in a dielectric insulating layer 10 by conventional processes known in the micro-electronic integrated circuit manufacturing process followed by deposition of an overlying first etching stop layer 12, for example, silicon nitride (e.g., SiN, $Si_3N_4$) or silicon carbide (e.g., SiC) to a thickness of about 300 Angstroms to about 700 Angstroms by a conventional CVD, LPCVD, PECVD, and HDP-CVD process.

Still referring to FIG. 1A, formed over first etching stop layer 12 is dielectric insulating layer 14, also referred to as an inter-metal dielectric (IMD) layer preferably formed of a low-K material having a porous structure, preferably with interconnecting pores, for example a silicon oxide based material such as carbon doped silicon oxide or organo-silicate glass (OSG). The IMD layer 14 preferably has a dielectric constant of less than about 3.0, for example from about 2.2 to about 3.0, preferably less than about 2.7. For example, the pore volume of the dielectric insulating layer is preferably from about 20% to about 60% pore volume with respect to any selected IMD layer volume portion. It will be appreciated that the dielectric constant may vary through the insulating dielectric (IMD) layer thickness. For example, a PECVD process using organo-silane and/or organo-siloxane precursors is carried out by known methods to produce the IMD layer 14.

It will be appreciated that a second etch stop layer (not shown) similar to etch stop layer 12, for example silicon nitride, may be provided overlying the first IMD layer e.g., 14 followed by deposition of a second IMD layer (not shown) in the same manner as the first IMD layer e.g., 14, in order to form a double dielectric insulating layer with an intervening etch stop layer in the formation of a dual damascene structure including a trench line overlying one or more via openings as is known in the art. The single IMD layer 14 shown in the exemplary embodiment is formed having a thickness of about 3000 to about 8000 Angstroms. The IMD layer 14 surface may optionally be covered with a capping layer (not shown) for example silicon oxide having a lower or essentially no pore volume, to protect the porous IMD layer in subsequent manufacturing processes.

Still referring to FIG. 1A, one or more hardmask/BARC layers, preferably a single inorganic layer e.g., layer 16 functioning as both a hard mask having anti-reflective properties e.g., a bottom anti-reflectance coating (BARC), for example preferably formed of silicon oxynitride, silicon oxycarbide, or titanium nitride, is provided over the IMD layer 14 at an appropriate thickness, preferably less than about 1000 Angstroms, to minimize light reflectance from the IMD layer 14 surface in a subsequent photolithographic patterning process.

Still referring to FIG. 1A, via openings e.g., 18A and 18B are formed by a conventional photolithographic patterning and reactive ion etch (RIE) process, preferably, but not exclusively formed having a diameter of less than about 0.25 microns, for example about 0.18 microns or less, and exposing the first etch stop layer 12. It will be appreciated that the conductive region 11 may optionally be exposed, but preferably, according to an aspect of the invention, a portion is left remaining in place to protect the underlying conductive portion 11 in subsequent etching processes.

Figure 1B:
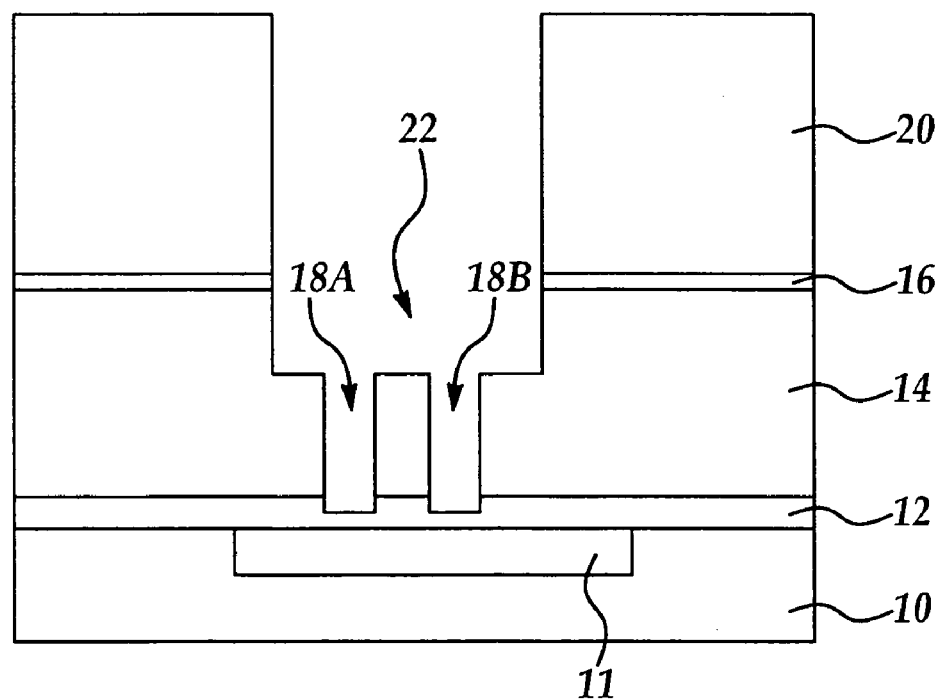

Referring to FIG. 1B, a photoresist layer 20 is deposited and patterned by a conventional photolithographic process and a conventional dry etching process is carried out to form a trench opening 22 overlying via openings 18A and 18B according to the patterned resist layer 20.

Following etching the trench opening 22, preferably, a portion of the first etch stop layer 12 is left remaining over the underlying conductive area 11, for example, copper, in order to protect the conductive area from oxidation in a subsequent plasma ashing/treatment process according to an aspect of the invention.

Figure 1C:
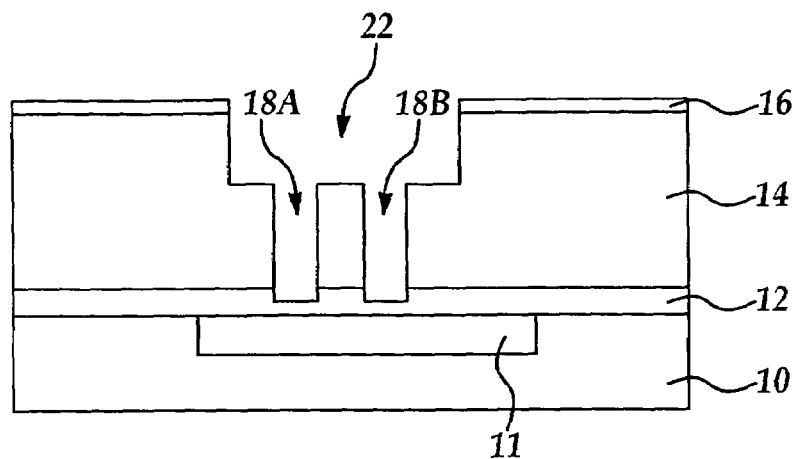

Referring to FIG. 1C, according to an aspect of the present invention, following formation of the trench opening 22 a plasma ashing/treatment process is carried out to substantially simultaneously remove the overlying resist layer 20 while plasma treating exposed portions of the IMD layer 14 within the dual damascene opening to increase a near surface density of the porous IMD layer. For example, the exposed IMD layer portions include the sidewalls and bottom portions e.g., of trench opening 22 and via openings 18A and 18B.

In one embodiment, the plasma ashing/treatment process preferably comprises nitrogen and hydrogen plasma source gases, preferably supplied to a conventional plasma reactor, for example an inductively coupled plasma source (ICP)) or dual plasma source (DPS) reactor to produce a nitrogen to hydrogen volumetric ratio (with respect to a plasma treatment volume) during the ashing process of from about 2:1 to about 5:1. Optionally, a small amount of oxygen containing gas such as NO, CO, $CO_2$, $N_2O$, more preferably $CO_2$, may be added, for example at about 1 to about 5 volume percent with respect to a plasma treatment gas volume to better control the plasma process. Exemplary plasma conditions include a pressure of about 10 mTorr to about 60 mTorr, and an RF power of about 300 Watts to about 600 Watts. The plasma ashing/treatment process is preferably carried out for a time period of from about 30 seconds to about 90 seconds.

In another embodiment, the plasma ashing/treatment process comprises plasma source gases including, preferably primarily consisting of, an inert gas and oxygen ($O_2$), the inert gas preferably being argon due to a relatively large mass and momentum transfer during plasma bombardment. The plasma reactor is preferably supplied with plasma source gases to produce an inert gas to $O_2$ volumetric ratio (with respect to a plasma treatment gas volume) during the plasma process of from about 3:1 to about 6:1. Exemplary plasma conditions using an inductively couple plasma (ICP) source reactor include a pressure of about 1 mTorr to about 20 mTorr, and an RF power of about 200 Watts to about 800 Watts, and zero bias power. The plasma ashing/treatment process is preferably carried out for a time period of from about 15 seconds to about 60 seconds.

For example, it has been found that by carrying out the plasma ashing/treatment process according to preferred embodiments, that the exposed dielectric insulating surfaces are densified and smoothed according to preferred plasma reactor conditions, thereby reducing the porous volume and size of penetrating pore openings in the near surface region of the porous IMD layer 14. The densification and smoothing effect is believed to be attributed to both plasma ion bombardment and chemical reaction with the near surface layer of the porous IMD layer 14. For example, both nitrogen and oxygen species may react with silicon to form, for example Si—O—Si or Si—N—Si bonds. For example it is believed that the near surface region, for example a region extending from the surface about 5 Angstroms to about 50 Angstroms into the IMD layer is densified as a result of the plasma ashing/treatment. Consequently, subsequent deposition of one or more barrier layers, preferably refractory metal and/or refractory metal nitrides by PVD and/or CVD processes over the etched opening has been found to be formed with better coverage and fewer voids, including being formed void free, thereby exhibiting improved properties, including a resistance to copper penetration.

For example, according to TEM analysis and positron annihilation measurements carried out on etched openings formed in porous low-K IMD layers according to preferred embodiments, and including one or more barrier layers produced according to preferred embodiments explained below, the barrier layers are produced without voids or pinholes, in contrast with prior art processes.

Figure 1D:
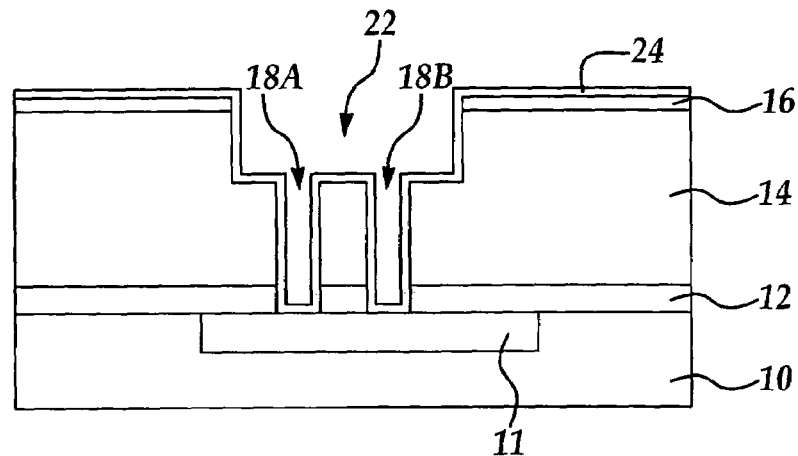

Referring to FIG. 1D, following the plasma ashing/treatment process, a conventional dry etching process, for example including nitrogen and fluorocarbons is carried out to etch through a remaining portion of the first etch stop layer 12 to reveal the underlying conductive portion 11. The dual damascene opening including trench opening 22 and via openings 18A and 18B are then lined with one or more barrier layers e.g., barrier layer 24, by a blanket deposition process such as a PVD and/or CVD process. The barrier layer 24 preferably includes at least one layer selected from a refractory metal, refractory metal nitride and silicided refractory metal nitride for example Ti, Ta, TiN, TiSiN, TaN, TiSiN, and TaSiN. In a most preferred embodiment, the barrier layer 24 is formed of tantalum nitride (TaN) by conventional PVD and/or CVD processes, for example when the subsequently deposited damascene metal is copper. The barrier layer 24 is preferably formed at a thickness of about 100 Angstroms to about 450 Angstroms, more preferably from about 100 Angstroms to about 300 Angstroms.

Figure 1E:
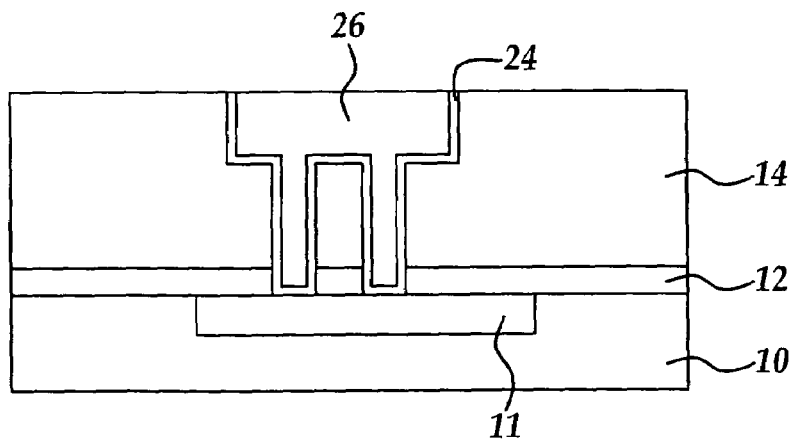

Referring to FIG. 1E, following barrier layer deposition, a conventional deposition process, for example PVD, CVD or electro-chemical deposition (ECD), preferably ECD is then carried out to fill the dual damascene with a blanket deposited metal layer, preferably copper, followed by conventional CMP processes to remove excess copper, including the barrier layer and BARC layer above the trench level to complete the formation of a dual damascene e.g., 26.

Thus, a plasma ashing/treatment process has been developed for simultaneously removing resist following an RIE etching process while simultaneously increasing a surface density and forming a smoother surface region of exposed portions of porous low-K IMD layer material. As a result, a process cycle time is minimized while providing an improved surface for subsequent barrier layer deposition thereby improving a barrier layer integrity at reduced thicknesses. The plasma treated porous IMD surface has been found according to positron annihilation analysis and TEM to enable formation of improved barrier layers at lower thicknesses without pinholes or voids, thereby allowing the scaling down of barrier layer thicknesses while ensuring adequate barrier layer resistance to metal penetration and electro-migration, for example, copper.

Figure 2:
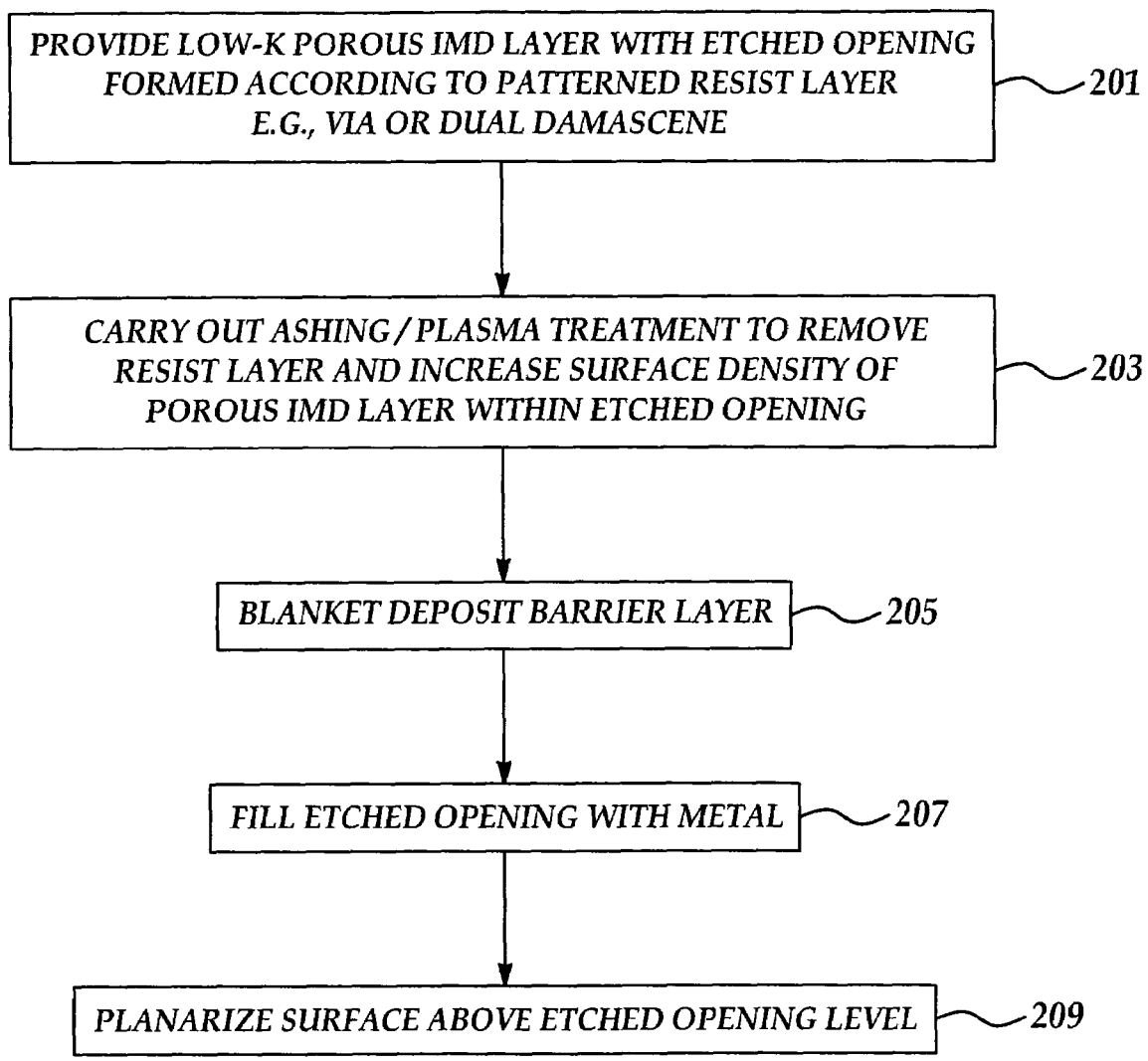
FIG. 2 is a process flow diagram according including several embodiments of the present invention.

Referring to FIG. 2 is a process flow diagram including several embodiments of the present invention. In process 201, a semiconductor process wafer including an etched opening is formed in a low-K porous IMD layer according to an etching process through lithographically patterned resist layer. In process 203, a plasma ashing/treatment process according to preferred embodiments is carried out to remove the overlying resist layer while simultaneously increasing a density of a near surface region of exposed porous low-K IMD portions within the etched opening. In process 205, a barrier layer according to preferred embodiments is deposited. In process 207, a metal filling layer, for example copper is deposited to fill the etched opening. In process 209 a planarization, e.g., CMP process is carried to planarize a surface above the etched opening level to complete a damascene formation process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma treating in a one step plasma treatment process an etched opening formed in a porous low-K material to improve barrier layer integrity comprising the steps of:
   providing a substrate comprising an etched opening formed in an insulating dielectric layer comprising porous low-K silicon oxide according to an overlying patterned resist layer;
   plasma treating in a one step plasma process the etched opening to remove the resist layer and increase a surface density of the insulating dielectric layer within the etched opening, said plasma process consisting essentially of plasma source gases selected from the group consisting of N2, H2, an oxygen containing gas selected from the group consisting of NO, CO, $CO_2$, and $N_2O$, and an inert gas; and,
   depositing a barrier layer over the etched opening.

2. The method of claim 1, wherein the plasma process comprises providing nitrogen ($N_2$) and hydrogen ($H_2$) plasma source gases.

3. The method of claim 2, wherein the plasma process source gases comprise a volumetric ratio of nitrogen ($N_2$) to hydrogen ($H_2$) with respect to a plasma treatment volume of from about 2:1 to about 5:1.

4. The method of claim 3, wherein the oxygen containing plasma source gas consists essentially of $CO_2$.

5. The method of claim 4, wherein the oxygen containing plasma source gas is provided at about 1% to about 5% by volume with respect to a plasma treatment plasma volume.

6. The method of claim 1, wherein the plasma process comprises providing plasma source gases consisting essentially of nitrogen ($N_2$), hydrogen ($H_2$), and said oxygen containing gas.

7. The method of claim 1, wherein the insulating dielectric layer is selected from the group consisting of carbon doped silicon oxide and organo-silicate glass.

8. The method of claim 1, wherein the insulating dielectric layer comprises a dielectric constant of from about 2.2 to about 3.0.

9. The method of claim 1, wherein the barrier layer is selected from the group consisting of Ti, Ta, TiN, TisiN, TaN, TiSiN, and TaSiN.

10. The method of claim 1, wherein the barrier layer consists essentially of tantalum nitride.

11. The method of claim 1, wherein the barrier layer is formed at a thickness of between about 100 Angstroms and about 450 Angstroms.

12. The method claim 1, further comprising the step of filling the etched opening with a metal selected from the group consisting of tungsten, aluminum, copper, and alloys thereof.

13. A method for plasma treating a damascene opening formed in a porous low-K IMD layer in a one step plasma treatment process to promote formation of a pinhole free barrier layer comprising the steps of:
   providing a semiconductor wafer comprising a patterned resist layer for etching a damascene opening formed in an IMD layer comprising porous low-K silicon oxide;
   etching a damascene opening according to the patterned resist layer;
   plasma treating the damascene opening in a one step process to remove the patterned resist layer while simultaneously increasing a surface density of exposed portions of the IMD layer, said plasma treatment consisting essentially of plasma source gases consisting of an oxygen containing gas and an inert gas;

depositing at least one barrier layer over the damascene opening: and, filling the damascene opening with metal according to a blanket deposition process.

14. The method of claim 13, wherein said oxygen containing gas consists essentially of oxygen ($O_2$) provided at less than about 5 Volume percent.

15. The method of claim 13, wherein said plasma source gases consist essentially of an inert gas and oxygen ($O_2$) provided at a volumetric ratio of inert gas to oxygen ($O_2$) from about 3:1 to about 6:1.

16. The method of claim 13, wherein said inert gas consists essentially of argon.

17. The method of claim 13, wherein IMD layer comprises material selected from the group consisting of carbon doped silicon oxide and organo-silicate glass.

18. The method of claim 13 where the IMD layer comprises interconnecting pores having a volume percent of about 20 to about 60 volume percent with respect to an IMD layer volume.

19. The method of claim 13, wherein the IMD layer comprises a dielectric constant of from about 2.2 to about 3.0.

20. The method of claim 13, wherein the barrier layer comprises materials selected from the group consisting of Ti, Ta, TiN, TiSiN, TaN, TiSiN, and TaSiN.

21. The method of claim 13, wherein the at least one barrier layer consists essentially of tantalum nitride.

22. The method of claim 13, wherein the at least one barrier layer is formed at a thickness of between about 100 Angstroms and about 450 Angstroms.

23. The method of claim 13, wherein the metal is selected from the group consisting of copper, tungsten, aluminum, and alloys thereof.

24. The method of claim 13 wherein the metal consists essentially of copper and alloys thereof.

* * * * *